(12) United States Patent
Mahadeswaraswamy et al.

(10) Patent No.: US 8,608,852 B2
(45) Date of Patent: Dec. 17, 2013

(54) TEMPERATURE CONTROLLED PLASMA PROCESSING CHAMBER COMPONENT WITH ZONE DEPENDENT THERMAL EFFICIENCIES

(75) Inventors: Chetan Mahadeswaraswamy, Sunnyvale, CA (US); Kallol Bera, San Jose, CA (US); Larry D. Elizaga, Tracy, CA (US)

(73) Assignee: Applied Materials, Inc., Santa Clara, CA (US)

( * ) Notice: Subject to any disclaimer, the term of this patent is extended or adjusted under 35 U.S.C. 154(b) by 76 days.

(21) Appl. No.: 13/111,384

(22) Filed: May 19, 2011

(65) Prior Publication Data

US 2011/0303641 A1 Dec. 15, 2011

Related U.S. Application Data

(60) Provisional application No. 61/354,158, filed on Jun. 11, 2010.

(51) Int. Cl.
    *C23C 16/00* (2006.01)
(52) U.S. Cl.
    USPC ........... 118/715; 118/724; 118/725; 118/699; 118/710; 118/712; 118/723 R; 156/345.34; 156/345.51; 156/345.52; 156/345.53
(58) Field of Classification Search
    USPC ................. 118/715, 724, 725, 699, 710, 712, 118/723 R; 156/345.51, 345.52, 345.53
    See application file for complete search history.

(56) References Cited

U.S. PATENT DOCUMENTS 5,540,899 A * 7/1996 Koves .......................... 422/200
2005/0133157 A1 * 6/2005 Choi .......................... 156/345.27
2006/0118243 A1 * 6/2006 Choi .......................... 156/345.51
2007/0022954 A1 * 2/2007 Iizuka et al. ................... 118/724
2007/0091539 A1 * 4/2007 Buchberger et al. .......... 361/234
2008/0083738 A1 * 4/2008 Ohata ............................ 219/497
2009/0294101 A1   12/2009 Fovell et al.

FOREIGN PATENT DOCUMENTS

| EP | 0766300 |   | 4/1997 |
|----|---------|---|--------|
| JP | 2003-243492 | * | 8/2003 |
| WO | WO0019519 |   | 4/2000 |
| WO | WO0221590 |   | 3/2002 |
| WO | WO2010055441 |   | 5/2010 |

OTHER PUBLICATIONS

International Search Report and Written Opinion for Application No. PCT/US2011/039183 dated Nov. 28, 2011, 7 pages.
International Preliminary Report on Patentability for Application No. PCT/US2011/039183 dated Dec. 27, 2012, 4 pages.

* cited by examiner

*Primary Examiner* — Jeffrie R Lund
*Assistant Examiner* — Satish Chandra
(74) *Attorney, Agent, or Firm* — Blakely, Sokoloff, Taylor & Zafman LLP

(57) ABSTRACT

Components and systems for controlling a process or chamber component temperature as a plasma process is executed by plasma processing apparatus. A first heat transfer fluid channel is disposed in a component subjacent to a working surface disposed within a plasma processing chamber such that a first length of the first channel subjacent to a first temperature zone of the working surface comprises a different heat transfer coefficient, h, or heat transfer area, A, than a second length of the first channel subjacent to a second temperature zone of the working surface. In embodiments, different heat transfer coefficients or heat transfer areas are provided as a function of temperature zone to make more independent the temperature control of the first and second temperature zones.

13 Claims, 8 Drawing Sheets

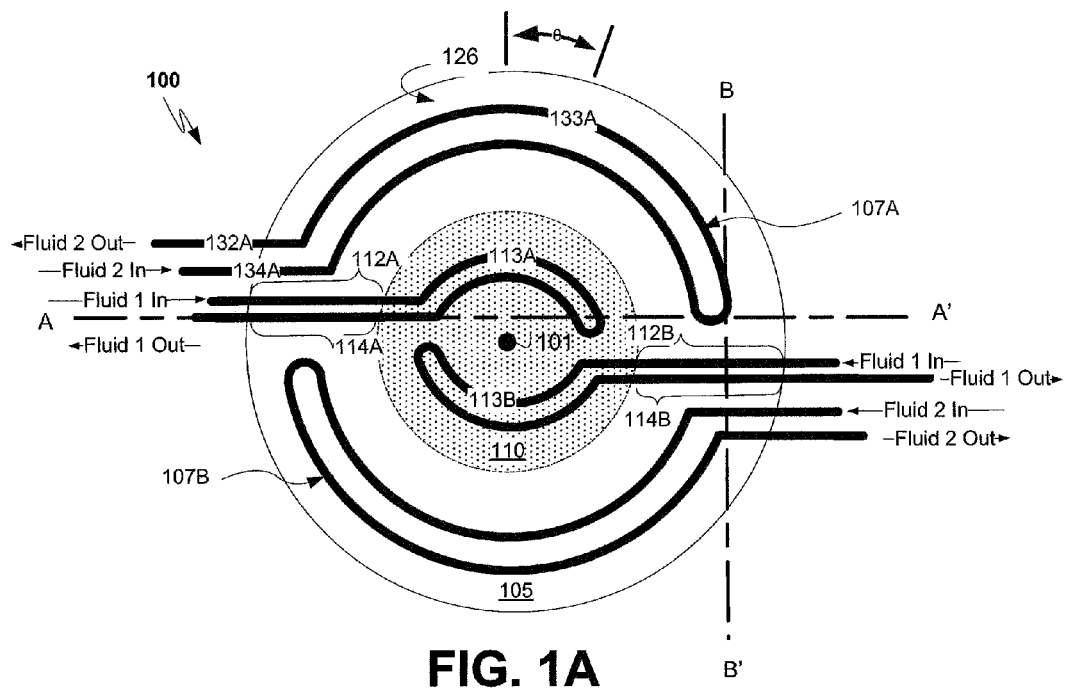
FIG. 1A
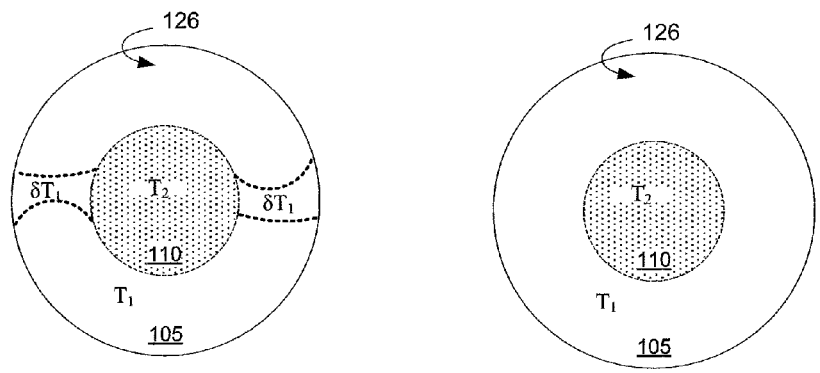
FIG. 1B  FIG. 1C

TEMPERATURE CONTROLLED PLASMA PROCESSING CHAMBER COMPONENT WITH ZONE DEPENDENT THERMAL EFFICIENCIES

CROSS-REFERENCE TO RELATED APPLICATIONS

This application claims the benefit of U.S. Provisional Application No. 61/354,158 filed Jun. 11, 2010, entitled "TEMPERATURE CONTROLLED PLASMA PROCESSING CHAMBER COMPONENT WITH ZONE DEPENDENT THERMAL EFFICIENCIES," the entire contents of which are hereby incorporated by reference in its entirety for all purposes.

BACKGROUND

1) Field

Embodiments of the present invention generally relate to plasma processing equipment, and more particularly to methods of controlling temperatures during processing of a workpiece within a plasma processing chamber.

2) Description of Related Art

In a plasma processing chamber, such as a plasma etch or plasma deposition chamber, the temperature of a chamber component is often an important parameter to control during a process. For example, a temperature of a substrate holder, commonly called a chuck or pedestal, may be controlled to heat/cool a workpiece to various controlled temperatures during the process recipe (e.g., to control an etch rate). Similarly, a temperature of a showerhead/upper electrode or other component may also be controlled during the process recipe to influence the processing (e.g., etch rate uniformity).

Often, various constraints on design of a plasma processing chamber necessitate introducing a heat transfer media to a temperature controlled component in a manner which results in heat transfer within portions of the component that are not desired. For example, where a process gas distribution showerhead or workpiece chuck has a plurality of zones which can be independently controlled to separate setpoint temperatures or to better manage disparate heat loads between the zones, a heat transfer media utilized for control of a first temperature zone (i.e., a target zone) may also pass proximate to a second temperature zone (i.e., a collateral zone) en route to, or from, the target temperature zone. As such, driving the plurality of temperature zones independently can introduce significant cross-talk between the zones as well as significant temperature non-uniformity within the collateral zone.

SUMMARY

Components and systems for controlling a process or chamber component temperature as a plasma process is executed by plasma processing apparatus are described herein. In certain embodiments, plasma processing chamber component having a working surface is disposed within a plasma processing chamber. A first heat transfer fluid channel is disposed in the component subjacent to the working surface such that a first length of the first channel subjacent to a first zone of the working surface comprises a different heat transfer coefficient, h, or heat transfer area, A, than a second length of the first channel subjacent to a second zone of the working surface. For example, where the second length is downstream of the first length, the first length has a lower heat transfer coefficient h than does the second length so that the first heat transfer fluid has a lesser impact (e.g., reduced heat transfer rate $\dot{Q}$) on the first zone temperature than the first heat transfer fluid does on the second zone. In embodiments, different heat transfer coefficients or heat transfer areas are provided as a function of temperature zone to make more independent the temperature control of the first and second temperature zones.

In a further embodiment, where the component includes a second heat transfer fluid channel disposed subjacent to the first zone of the working surface, the heat transfer coefficient or heat transfer area along a length of the second channel is made greater than that of the first length of the first channel so that a second heat transfer fluid passing through the second channel may have a greater impact on the first zone temperature than does the first heat transfer fluid passing through the first length of the first channel. In one exemplary embodiment, where the component is a substrate chuck or process gas showerhead, the working surface is circular and the first zone comprises an annular portion of the circular working surface which surrounds the second zone.

In certain embodiments, the lengths of heat transfer fluid channels are engineered to modulate one of a heat transfer coefficient or heat transfer area. In one particular embodiment, the heat transfer coefficient along the first length is made lower than the second length through incorporation of a sleeve of a thermally resistive material about the first length of channel to increase the thermal resistance relative to the second length. In another embodiment, a first length of the first channel is disposed at a greater distance subjacent to the working surface along the first length than along the second length and/or at a greater distance than is a length of the second heat transfer fluid channel. A thermal break, such as an evacuate space or non-metallic material may in addition, or in the alternative, be disposed between the first channel and the working surface along at least a portion of the first length to increase the thermal resistance relative to the second length.

In embodiments, the heat transfer area along the first length is made lower than the second length, for example through incorporation of fins along the second length that are absent in the first length.

Embodiments include a plasma processing chamber, such as a plasma etch or plasma deposition system, having a temperature-controlled component to be coupled to a heat sink/heat source. The temperature-controlled component may be coupled to a first heat sink/source by a first heat transfer fluid loop, the first fluid loop passing through first and second lengths of a channel embedded in first and second zones of the temperature-controlled component, respectively. The temperature-controlled component may be further coupled to a second heat sink/source by a second heat transfer fluid loop, the second fluid loop passing through channel lengths embedded only in the first zone. The first length of the first channel may have a heat transfer coefficient or heat transfer area different than that of the second length and/or second channel.

BRIEF DESCRIPTION OF THE DRAWINGS

Embodiments of the invention are particularly pointed out and distinctly claimed in the concluding portion of the specification. Embodiments of the invention, however, both as to organization and method of operation, together with objects, features, and advantages thereof, may best be understood by reference to the following detailed description when read with the accompanying drawings in which:

FIG. 1A is a layout view of a temperature controlled plasma processing chamber component comprising a working surface having a plurality of temperature zones, in accordance with an embodiment of the present invention;

FIGS. 1B and 1C are plan views of the temperature controlled plasma processing chamber component illustrated in FIG. 1A, illustrating working surface temperature variations in a first zone, in accordance with an embodiments of the present invention

DETAILED DESCRIPTION

In the following detailed description, numerous specific details are set forth in order to provide a thorough understanding of embodiments of the invention. However, it will be understood by those skilled in the art that other embodiments may be practiced without these specific details. In other instances, well-known methods, procedures, components and circuits have not been described in detail so as not to obscure the present invention.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" my be used to indicated that two or more elements are in either direct or indirect (with other intervening elements between them) physical or electrical contact with each other, and/or that the two or more elements co-operate or interact with each other (e.g., as in a cause and effect relationship).

Described herein are plasma chamber components including a first heat transfer fluid channel in which a portion of the channel disposed outside of a target temperature zone of the component is designed to have a lower heat transfer coefficient h or heat transfer area A than a portion of the first channel disposed within the target zone of the component. By reducing the heat transfer coefficient h and/or heat transfer area A, the effect of the heat transfer fluid flowing through the first channel portion outside of the target zone on the temperature of a working surface of the component outside of the target zone may be reduced even if the thermodynamic driving force $\Delta T$ is largest outside of the target temperature zone. This is particularly advantageous for plasma chamber components that include a second temperature-controlled zone through which the first heat transfer fluid channel passes through to access the target zone. As such, a temperature of a working surface in the second zone is made less of a function of the first heat transfer fluid channel and uniformity of the surface temperature within the second zone may be improved.

Figure 7:
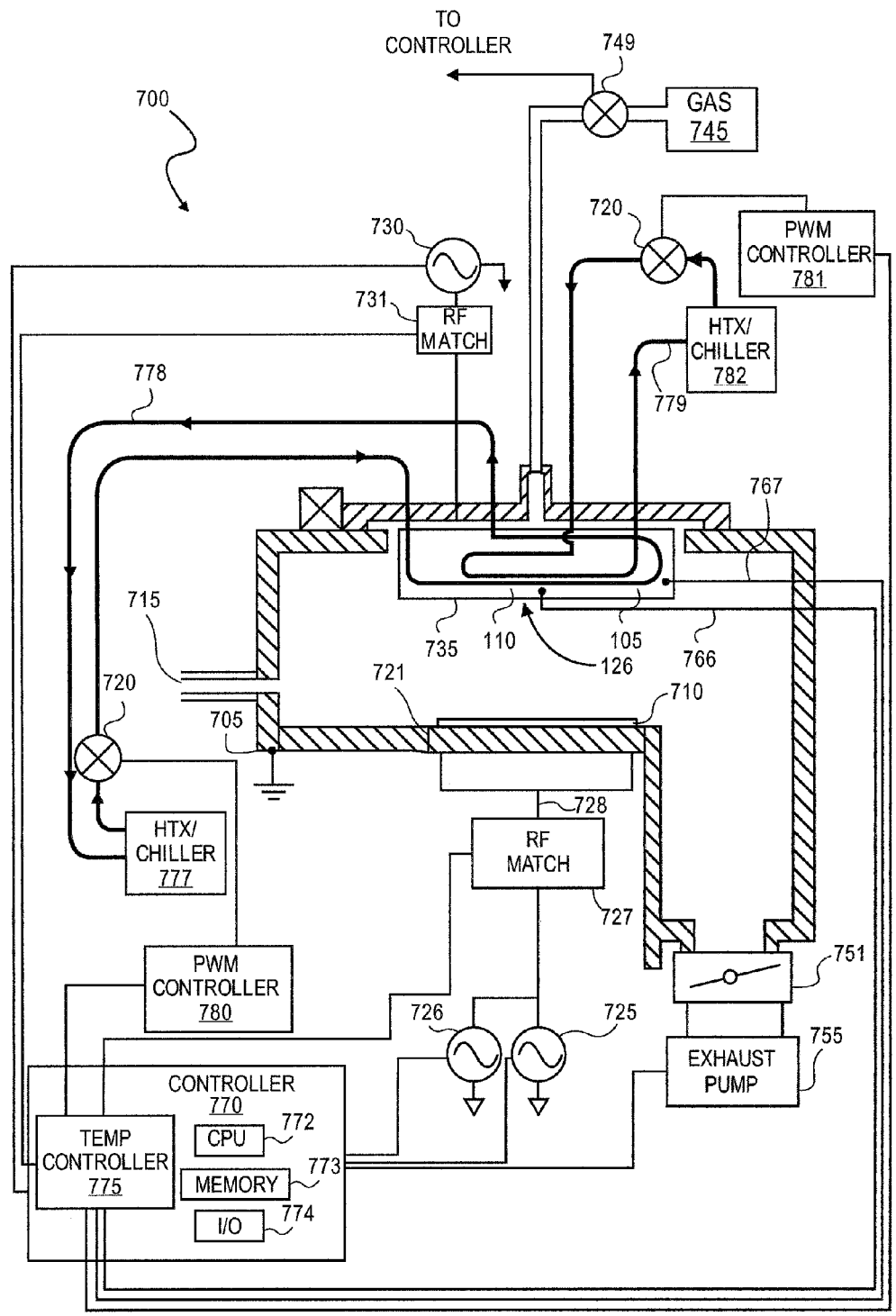
FIG. 7 illustrates a schematic of a plasma etch system including a temperature controlled process gas showerhead, in accordance with an embodiment of the present invention.
Figure 8:
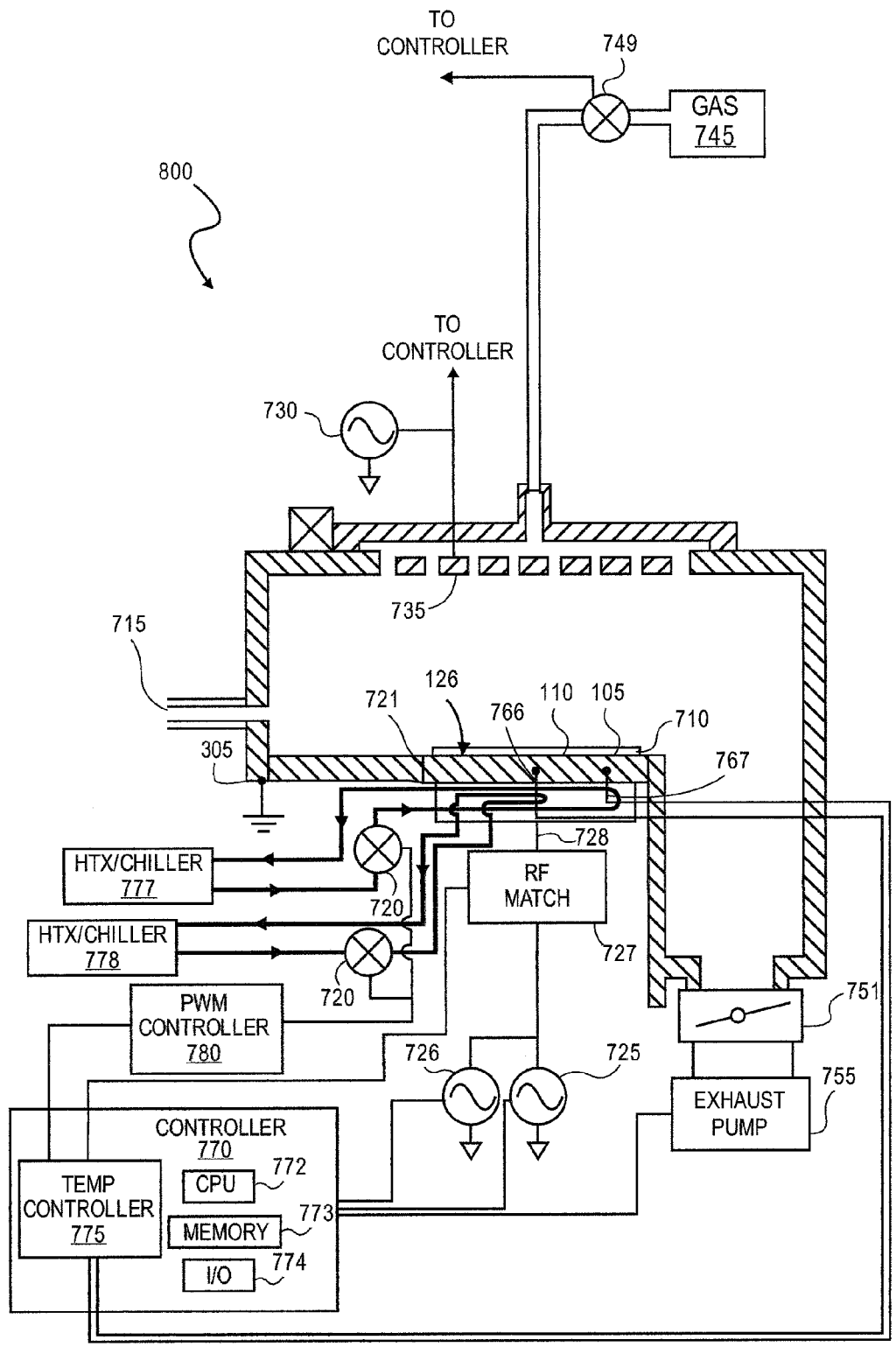
FIG. 8 illustrates a schematic of a plasma etch system including a temperature controlled substrate supporting chuck, in accordance with an embodiment of the present invention.

In an embodiment, a temperature-controlled plasma processing chamber component includes a working surface disposed within a plasma processing chamber, such as the plasma etch systems depicted further in FIGS. 7 and 8. FIG. 1A is a layout view of exemplary temperature-controlled plasma processing chamber component 100, in accordance with an embodiment of the present invention. In a first exemplary embodiment, as further illustrated in FIG. 7, the component 100 is a process gas distribution showerhead through which a process gas may be provided to a plasma processing chamber. In a second exemplary embodiment, as further illustrated in FIG. 8, the component 100 is a workpiece supporting chuck or pedestal upon which a workpiece is disposed during a plasma processing operation. In still another embodiment, a temperature-controlled plasma processing chamber component adapted to provide the features/functionality described herein for the exemplary embodiments includes a chamber wall liner.

For the first and second exemplary embodiments, the component 100 includes a circular working surface 126 which may be exposed to the plasma (e.g. for a showerhead embodiment) or may be supporting a workpiece (e.g., for a chuck embodiment). In FIG. 1A, the working surface 126 may be considered transparent for the purpose of visualizing heat transfer fluid channels subjacent to (below) the working surface 126. The working surface 126 however is typically to be of a semiconductor (e.g., silicon) an anodized surface (e.g., $Al_2O_3$), a ceramic (e.g., ytterium oxides), or any other material conventional to a plasma processing apparatus. As illustrated, the temperature zone 105 has an annular shape while the temperature zone 110 is circular in shape and encircled or circumscribed by the temperature zone 105 to form "inner" and "outer" temperature zones of the component 100. The annular arrangement of the zones 105 and 110 is a function of the cylindrical symmetry of a plasma processing apparatus configured to process disk-shaped wafer substrates conventional in the semiconductor/microelectronic/electro-optical manufacturing art and it should be appreciated that in other embodiments two temperature zones may merely be adjacent (e.g., for in-line plasma processing apparatuses conventional in photovoltaic manufacture, etc.).

In an embodiment, a temperature-controlled plasma processing chamber component includes at least one heat transfer fluid channel subjacent to a working surface 126 and forming a portion of a heat transfer fluid loop coupled to the plasma processing apparatus. The heat transfer fluid may be any heat transfer fluid known in the art to be suitable for the purpose(s) of transferring heat to/from the component 100 (specifically the working surface 126 where a heat load will be placed) for the purpose of controlling one or more of the plurality of temperature zones. Examples of suitable heat transfer fluids include water-based mixtures, such as Galden® (available from Solvay S.A.) or Fluorinert™ (available from 3M Company). In the exemplary embodiment depicted, a first heat transfer fluid channel includes a plurality of fluid channel lengths 112A, 113A and 114A. As depicted, heat transfer fluid 1 flows into the component 100, through a first channel length 112A, to a second channel length 113A downstream of the first channel length 112A, to a third channel length 114A downstream of the second channel length 113A, and out of the component 100. The channel lengths 112A, 113A, 114A are embedded within the component 100 to be subjacent to the working surface 126.

In an embodiment, a temperature-controlled plasma processing chamber component includes a plurality of temperature zones. Generally, the temperature zones are adjacent/circumjacent regions of a working surface to be disposed within a plasma processing chamber and the temperature zones are controllable to a setpoint temperature independent of one another. Independence of the temperature zones prevents different heat transfer fluid flows within the different zones (as provided to control a target zone's temperature) from affecting the temperature another zone (e.g., collateral zone). For example, where some form of feedback/feedforward control is utilized and according to the control algorithm a first zone required a large heat transfer fluid flow and a second required no heat transfer fluid flow then the large flow through the heat transfer fluid channel accessing the first zone via the second zone should not alter the temperature of the second zone.

The temperature zone for which a particular heat transfer fluid controls (i.e., target zone) is a function of the heat transfer rate $\dot{Q}$ provided by the heat transfer fluid passing through a particular heat transfer fluid channel within that zone, with fluid channels that provide a higher heat transfer rate $\dot{Q}$ applying a larger control effort at a particular location on the working surface 126. Generally, the larger the disparity in heat transfer rate $\dot{Q}$ a heat transfer fluid has between different temperature zones (e.g., $\dot{Q}_{zone\ 1}$ to $\dot{Q}_{zone\ 2}$), the lower the cross-talk, and greater the temperature independence of adjacent zones. Consider a heat transfer matrix between a first temperature zone and a second temperature zone:

$$\begin{matrix} \dot{Q}_{11} & \dot{Q}_{12} \\ \dot{Q}_{21} & \dot{Q}_{22} \end{matrix},$$

where $\dot{Q}_{11}$ represents a first heat transfer fluid affect on zone 1, $\dot{Q}_{12}$ represents the first heat transfer fluid affect on the second zone, $\dot{Q}_{21}$ represents the second heat transfer fluid affect on the first zone and $\dot{Q}_{22}$ represents the second heat transfer fluid affect on the second zone. The crosstalk terms $\dot{Q}_{12}$ and $\dot{Q}_{21}$ are to be minimized while maximizing $\dot{Q}_{11}$ and $\dot{Q}_{22}$ for independent temperature control of each zone (e.g., via a feedforward and/or feedback mechanism).

In one embodiment, a plurality of temperature zones is provided via a plurality of heat transfer elements within the temperature-controlled component. A heat transfer element may be any known in the art, such as a heat transfer fluid channel, a thermoelectric (TE) element, a resistive heating element, etc. In the exemplary embodiment including a first heat transfer fluid channel, a plurality of temperature zones may be provided by adding a second, third, etc. heating element in combination with the first heat transfer fluid channel. For example, a first heat transfer fluid channel may be combined with a TE element or a resistive heating element. For the exemplary embodiment illustrated in FIG. 1A, however, a first heat transfer fluid channel is combined with a second heat transfer fluid channel 107A to provide the plurality of temperature zones. More specifically, the second heat transfer fluid channel 107A is subjacent to the temperature zone 105. As illustrated, all lengths 132A, 133A and 134A of the second heat transfer fluid channel 107A are within the temperature zone 105 so that the fluid 2 feeds into the component 100 and out of the component 100 without passing through another temperature zone.

In an embodiment, the temperature-controlled plasma processing chamber component 100 includes at least one heat transfer fluid channel having channel lengths within more than one temperature zone. In the exemplary embodiments represented by FIG. 1A, a first heat transfer fluid channel has channel lengths in both the temperature zone 105 (e.g., lengths 112A and 114A) and temperature zone 110 (e.g., length 113A). Thus, at least a feed and/or a return of the fluid 1 passes through the temperature zone 105. Depending on the path configuration of a heat transfer fluid channel, a channel length in a first zone (e.g., temperature zone 105) may be approximately equal in length to a channel length in a second, adjacent zone (e.g., temperature zone 110). Whether the second temperature zone (e.g., temperature zone 110) is controlled via a second heat transfer fluid channel or otherwise (e.g., TE element), having at least one heat transfer fluid channel with channel lengths within more than one temperature zone may induce undesirable cross-talk between adjacent temperature zones (e.g., large $\dot{Q}_{12}$ and $\dot{Q}_{21}$ terms) and induce significant variation in the temperature of a component's working surface, as illustrated in FIG. 1B. Nevertheless, other hardware limitations (e.g., process gas distribution assemblies, lift pin assemblies, etc.) may motivate such a fluid channel layout.

As further illustrated in FIG. 1A, additional heat transfer fluid channels may be incorporated into the component 100 to improve surface temperature control (e.g., uniformity of heat transfer rate). For example, the temperature zone 110 further includes a third heat transfer fluid channel including lengths 112B, 113B, and 114B disposed in the component 100 in a manner symmetrical to the lengths 112A, 113A, and 114B about a central axis 101 of the component (i.e., azimuthally (θ) symmetrical) to provide a second, parallel source of fluid 1 into the temperature zone 110. Analogously, the temperature zone 105 further includes a fourth heat transfer fluid channel 107B disposed in the component 100 in a manner symmetrical to the second heat transfer fluid channel 107A about a center of the component. For clarity of discussion, lengths 112A, 113A, 114A, 112B, 113B, and 114B are referenced in the alternative, as is channel 107A and channel 107B, with the understanding that characteristics of references numbers with an "A" suffix are also applicable to the same reference number with a "B" suffix.

In embodiments, lengths of a heat transfer fluid channel within a target temperature zone have a different heat transfer coefficient h or different heat transfer area A than do lengths of the heat transfer fluid channel outside of the target temperature zone (i.e., within a collateral temperature zone). In an embodiment, a first length of the first channel subjacent to a first zone of the working surface comprises a different heat transfer coefficient h than a second length of the first channel subjacent to a second zone of the working surface. For the exemplary embodiments represented by FIG. 1A, the heat transfer coefficient h along the channel length 112A is different than the heat transfer coefficient h along the channel length 113A. In a particular embodiment, the heat transfer coefficient h along the channel length 112A is lower than the heat transfer coefficient h along the channel length 113A.

In another embodiment, a first length of the first channel subjacent to a first zone of the working surface comprises a different heat transfer area A than a second length of the first channel subjacent to a second zone of the working surface. For the exemplary embodiments represented by FIG. 1A, the heat transfer area A along the channel length 112A is different than the heat transfer area A along the channel length 113A. In a particular embodiment, the heat transfer area A along the channel length 112A is lower than the heat transfer area A along the channel length 113A.

In further embodiments, the amount by which the heat transfer coefficient h and/or the heat transfer area A is lower along the first channel length than the second channel length is larger than any reduction in $\Delta T$ between the two channel lengths such that a relatively lower heat transfer rate in the first channel length is achieved even for an upstream length of the channel where $\Delta T$ may be expected to be greater than for a downstream length. For the exemplary embodiments represented by FIG. 1A, the product hA along the channel length 112A is lower than the product hA along the channel length 113A.

In a further embodiment, a third length of a first heat transfer fluid channel downstream of the second length and also subjacent to the first zone has a heat transfer coefficient h or heat transfer area A that is lower than along the second length. For example, referring back to FIG. 1B, the length 114A has a lower heat transfer coefficient h and/or heat transfer area A than along the length 113A (length within target zone 110). As such, where either or both the heat transfer coefficient h and/or the heat transfer area A is reduced sufficiently for a first channel (e.g., 112A) disposed in a non-targeted zone (e.g., 105), cross-talk with a second channel (e.g., 107A) disposed subjacent to the first zone may be reduced and where the second channel is to conduct a second heat transfer fluid at a second temperature, the temperature of the working surface (e.g., 126) within the first zone may be made more uniformly controlled to a setpoint temperature by the second heat transfer fluid targeted at the first zone (e.g., as depicted in FIG. 1C).

Figure 2A:
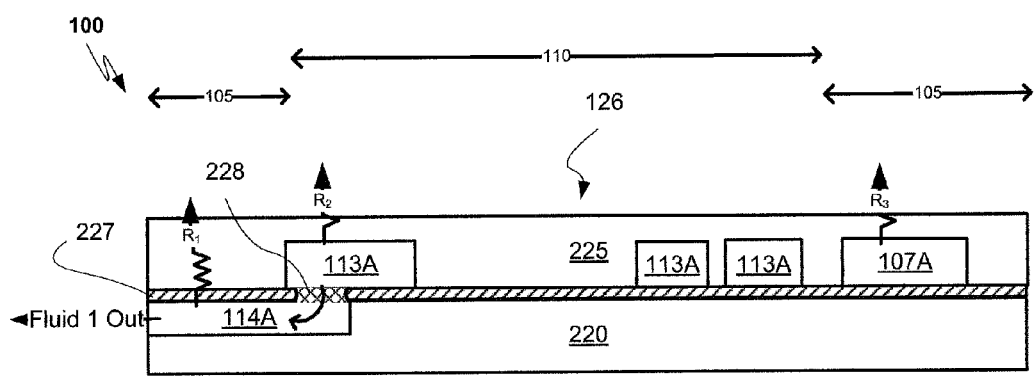
FIG. 2A illustrates a cross-sectional view along the A-A' line of the temperature controlled plasma processing chamber component depicted in FIG. 1, in accordance with an embodiment of the present invention.

FIG. 2A illustrates a cross-sectional view along the A-A' line of the temperature controlled plasma processing chamber component 100 depicted in FIG. 1, in accordance with an embodiment of the present invention. The component 100 is a multi-leveled assembly including at least a first layer 220 and a second layer 225. Each layer 220 and 225 may, for example, be of a material conventional to a single level component. In certain embodiments, the second layer 225 is of a material with high thermal conductivity to reduce thermal spreading resistance across the working surface 126. In other embodiments however, the second layer 225 is of a material with low thermal conductivity to localize heat transfer to regions of the working surface 126 most proximate to a heat transfer fluid channel.

The component 100 further includes a plurality of heat transfer fluid channel levels with the channel length 114A formed within the layer 220 and the channel length 113A formed within the layer 225. The first and second heat transfer fluid levels are interconnected via connectors 228 formed in a capping layer 227. In a particular embodiment, the component 100 first layer 220 is machined to form a first pattern of first heat transfer fluid channel lengths (e.g., length 114A). The capping layer 227 is then machined to have connectors 228 corresponding to locations of the first heat transfer fluid channels and then affixed (e.g., brazed, soldered, thermally bonded, etc.) to the first level 200, thereby enclosing the first heat transfer fluid channels. The second layer 225 is similarly machined to form a second pattern of second heat transfer fluid channel lengths (e.g., length 113A) and the second layer 225 is similarly affixed to the capping layer 227. The thermal resistance $R_1$ in the collateral zone (e.g., zone 105) may be made substantially larger than the thermal resistance $R_2$ in the target zone (e.g., zone 110), for example because of the lower heat transfer coefficient attributable to the larger distance and/or the additional capping layer 227 (which may be selected to have a relatively lower thermal conductivity) between the working surface 126 and the channel length 114A relative to the channel length 113A.

As further illustrated in FIG. 2A, the heat transfer coefficient h and/or heat transfer area A along the length 114A of the first channel is lower than along an equal length of the second channel 107A. Where the second channel 107A is targeted to provide temperature control of the working surface 126 in the zone 105, the second channel 107A is disposed within the layer 225 to be more proximate to the working surface 126 than is the length 114. For embodiments as depicted in FIG. 1A, where the entire second channel 107A is disposed with the zone 105, all lengths 132A, 133A and 134A may be disposed within the layer 225. However sections 132A and 134A may be in layer 220 as it may affect the symmetry about the central axis 101 along the azimuth angle $\theta$.

Figure 2B:
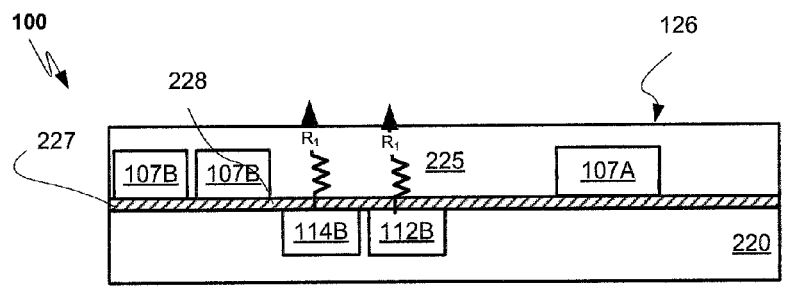
FIG. 2B illustrates a cross-sectional view along the B-B' line of the temperature controlled plasma processing chamber component depicted in FIG. 1, in accordance with an embodiment of the present invention.

FIG. 2B illustrates a cross-sectional view along the B-B' line of the temperature controlled plasma processing chamber component 100 depicted in FIG. 1, in accordance with an embodiment of the present invention. As further illustrated, both the first and third lengths 112B and 114B of a heat transfer fluid channel within the non-targeted temperature zone 105 are associated with larger thermal resistances R1, for example because of the lower heat transfer coefficient h attributable to the larger distance and/or the additional capping layer 227 (which may be selected to have a relatively lower thermal conductivity) between the working surface 126 and the first and third heat transfer fluid channel lengths 112B and 114B.

Figure 3A:
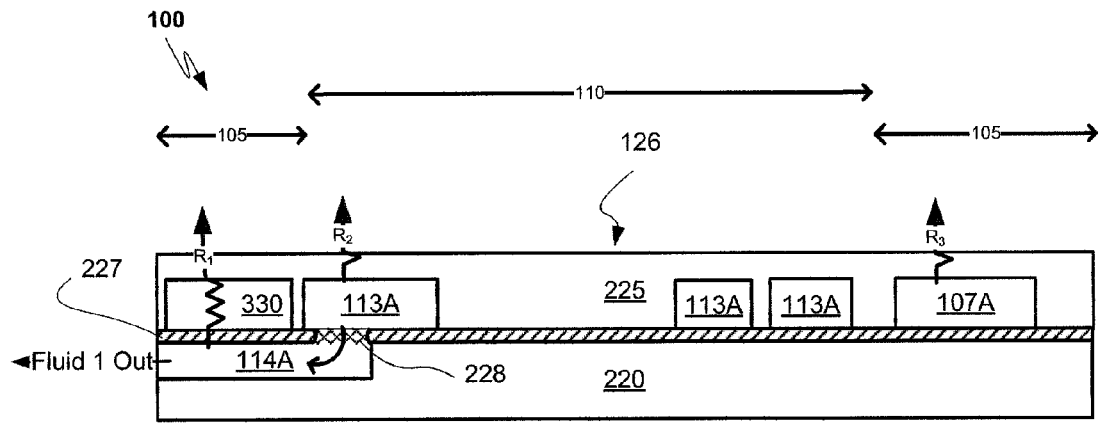
FIG. 3A illustrates a cross-sectional view along the A-A' line of the temperature controlled plasma processing chamber component depicted in FIG. 1, in accordance with an embodiment of the present invention.

In an embodiment, a temperature-controlled component includes a thermal break disposed between a working surface and a length of a heat transfer fluid channel in a non-targeted temperature zone to increase the thermal resistance relative to a second length of the heat transfer fluid channel located within a target temperature zone. A thermal break comprises a region of a relatively lower thermal conductivity than the bulk of component 100. FIG. 3A illustrates a cross-sectional view along the A-A' line of the temperature controlled plasma processing chamber component 100 depicted in FIG. 1, in accordance with an embodiment of the present invention. As shown, a thermal break 330 is disposed between at least a portion of the channel length 114A and the working surface 126 to increase the thermal resistance between the working surface 126 and a point within the channel length 114A to R1 relative to the thermal resistance R2 between the working surface 126 and a point within the channel length 113A. In one embodiment, the thermal break 330 comprises an evacuated or rarefied space. The thermal break 330 may be formed as a channel in the layer 225 in a manner similar to the heat transfer fluid channel 113A, however the thermal break 330 is sealed by the capping layer 227 such that no connector 228 is provided subjacent to the thermal break 330 and a void which is not to conduct a heat transfer fluid is formed within the layer 225. In other embodiments, the channel formed in layer 225 is filled with a material having a lower thermal conductivity than the bulk of the layer 225, for example a non-metallic material, such as ceramics, plastics, polyimides, Teflon®, Kapton®, etc. In an alternative embodiment, the capping layer 227 may further serve the function of a thermal break either by incorporating a rarefied space between opposing surfaces of the capping layer 227 (each mating with one of the layers 220 and 225) or by comprising a material of relatively lower thermal conductivity.

Figure 3B:
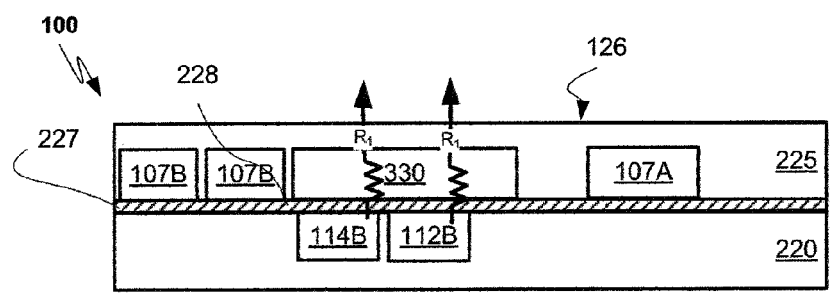
FIG. 3B illustrates a cross-sectional view along the B-B' line of the temperature controlled plasma processing chamber component depicted in FIG. 1, in accordance with an embodiment of the present invention.

FIG. 3B illustrates a cross-sectional view along the B-B' line of the temperature controlled plasma processing chamber component 100 depicted in FIG. 1, in accordance with an embodiment of the present invention. As illustrated, both the first and third lengths 112B and 114B of a heat transfer fluid channel within the non-targeted temperature zone 105 are associated with larger thermal resistances R1, for example because of the lower heat transfer coefficient h attributable to the thermal break having a relatively lower thermal conductivity than the bulk of layer 225 between the working surface 126 and the first and third heat transfer fluid channel lengths 112B and 114B.

Figure 4A:
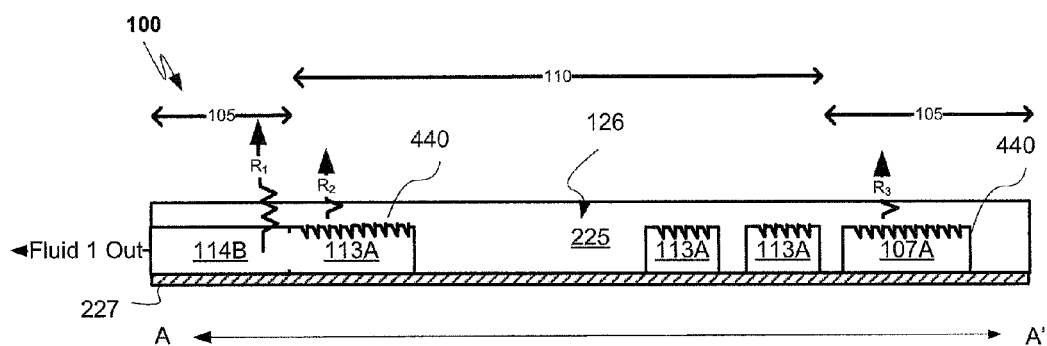
FIG. 4A illustrates a cross-sectional view along the A-A' line of the temperature controlled plasma processing chamber component depicted in FIG. 1, in accordance with an embodiment of the present invention.

In one embodiment, a heat transfer fluid channel comprises a number of fins along a length within a target temperature zone that are absent from a length of the channel outside of the target zone such that the heat transfer area A is made larger in for the channel length within the target zone. FIG. 4A illustrates a cross-sectional view along the A-A' line of the temperature controlled plasma processing chamber component 100 depicted in FIG. 1, in accordance with an embodiment of the present invention. As depicted, within the zone 110, the channel length 113A includes a plurality of topological features 440 (e.g., fins), increasing the heat transfer area/length (A/L) for a channel length 113A relative the channel length 114B. As such the cumulative thermal resistance R2/length along the channel length 113A may be made less than the thermal resistance R1/length along the channel length 114B. In certain further embodiments, topological features 440 may also be provided in a second heat transfer fluid channel 107A.

Figure 4B:
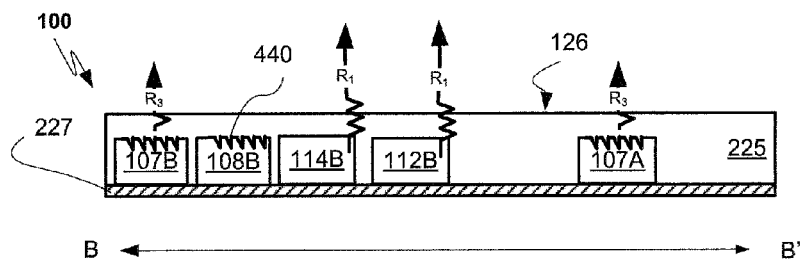
FIG. 4B illustrates a cross-sectional view along the B-B' line of the temperature controlled plasma processing chamber component depicted in FIG. 1, in accordance with an embodiment of the present invention.

FIG. 4B illustrates a cross-sectional view along the B-B' line of the temperature controlled plasma processing chamber component 100 depicted in FIG. 1, in accordance with an embodiment of the present invention. As illustrated, both the first and third lengths 112B and 114B of a heat transfer fluid channel within the non-targeted temperature zone 105 are associated with larger thermal resistances R1, for example because of a lower heat transfer area/length A/L attributable to the absences of topological features 440 in heat transfer fluid channel lengths 112B and 114B. As further illustrated in FIGS. 4A and 4B, modulation of the heat transfer area between lengths of a heat transfer fluid channel may allow for a simplified assembly including only the layer 225 and a single level of channels. Of course, because most any embodiment described herein may be combined with any other, a multi-level channel configuration (e.g., FIGS. 2A-3B) may also be implemented in combination with the modulation in heat transfer area to increase the disparity in heat transfer rate between various lengths of the channel.

Figure 5A:
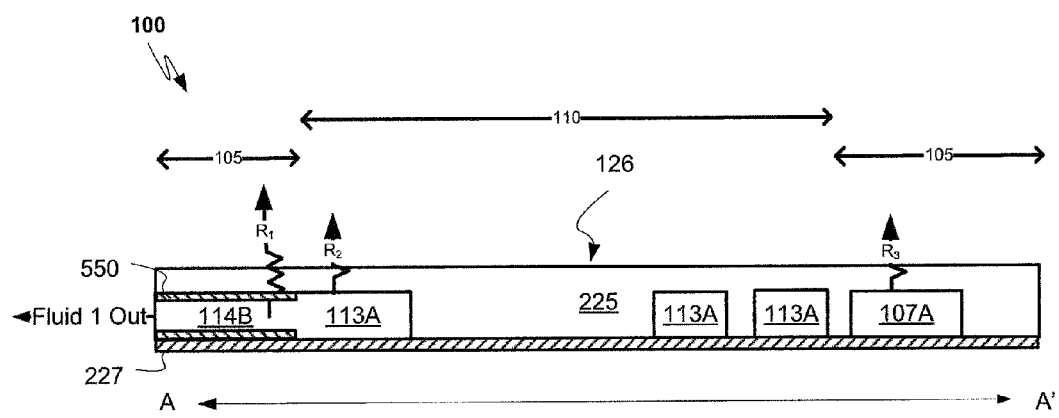
FIG. 5A illustrates a cross-sectional view along the A-A' line of the temperature controlled plasma processing chamber component depicted in FIG. 1, in accordance with an embodiment of the present invention.
Figure 5B:
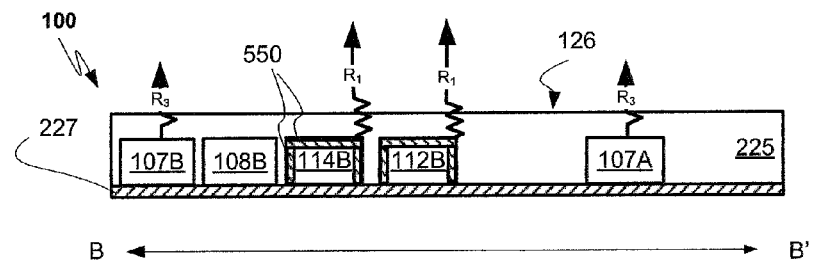
FIG. 5B illustrates a cross-sectional view along the B-B' line of the temperature controlled plasma processing chamber component depicted in FIG. 1, in accordance with an embodiment of the present invention.

In an embodiment a thermally resistive material forms a sleeve around a heat transfer fluid channel length to increase the thermal resistance relative to a second length of the channel lacking such a channel sleeve. FIG. 5A illustrates a cross-sectional view along the A-A' line of the temperature controlled plasma processing chamber component 100 depicted in FIG. 1, in accordance with an embodiment of the present invention. As illustrated, a thermally resistive channel sleeve 550 is present along at least a portion of the channel length 114B. The thermally resistive material may, for example be any of those described for thermal break embodiments with the primary distinction between thermal break embodiments and thermally resistive sleeve embodiments being that the thermally resistive material is disposed adjacent to sidewalls of the heat transfer fluid channel in addition to being present between the heat transfer fluid channel and the working surface. As further illustrated in FIG. 5A, the thermally resistive sleeve 550 may further be disposed on a side of the channel opposite the working surface to completely surround the channel with the thermally resistive material. In other embodiments however, the thermally resistive sleeve 550 is only present on 3 sides of the channel (e.g., as depicted in FIG. 5B illustrating a cross-sectional view along the B-B' line of the temperature controlled plasma processing chamber component 100 depicted in FIG. 1).

Thermally resistive channel sleeve embodiments may further allow for a single channel level construction of the component (e.g., embedded within layer 225). Many techniques known in the art may be utilized to form the thermally resistive sleeve 550, depending on the thermally resistive material chosen. For example, a coating process may be selectively applied and/or selectively removed to/from lengths of channels machined into the layer 225. In other embodiments, large regions of layer 225 replaced with the thermally resistive material is then machined to form channels within the thermally resistive material. As further illustrated in FIG. 5B, both the first and third lengths 112B and 114B of a heat transfer fluid channel within the non-targeted temperature zone 105 are associated with larger thermal resistances R1, for example because of a lower heat transfer coefficient attributable to the resistive sleeves 550 along the heat transfer fluid channel lengths 112B and 114B.

Figure 6A:
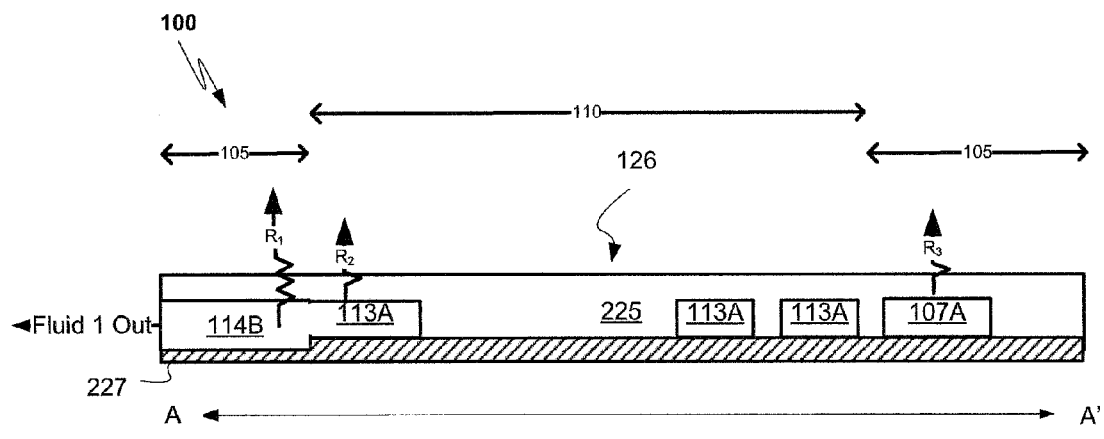
FIG. 6A illustrates a cross-sectional view along the A-A' line of the temperature controlled plasma processing chamber component depicted in FIG. 1, in accordance with an embodiment of the present invention.
Figure 6B:
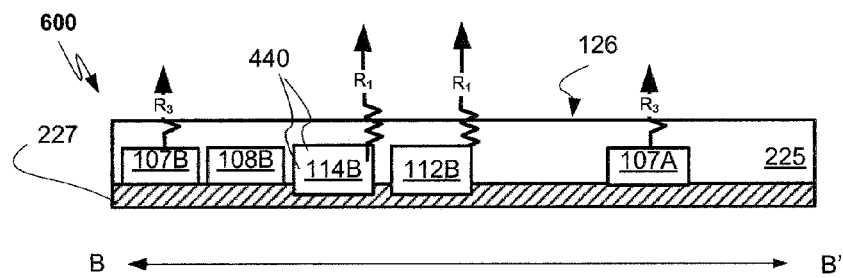
FIG. 6B illustrates a cross-sectional view along the B-B' line of the temperature controlled plasma processing chamber component depicted in FIG. 1, in accordance with an embodiment of the present invention.

In another embodiment, a heat transfer fluid channel length has a first cross-sectional area larger than a second cross-sectional area of a second length to modulate an extent of convection occurring within the heat transfer fluid as it passes through the fluid channel during operation. FIG. 6A illustrates a cross-sectional view along the A-A' line of the temperature controlled plasma processing chamber component 100 depicted in FIG. 1, in accordance with an embodiment of the present invention. In the exemplary embodiment depicted, a cross-sectional area of along the channel length 114B is sufficiently large to ensure laminar flow of the heat transfer fluid along at least a portion of the channel length 114B while the cross-sectional area along the channel length 113B is sufficiently small to induce turbulent flow of the heat transfer fluid along at least a portion of the channel length 113B. In other embodiments where the heat transfer fluid flow velocity within the channel length 114B and 113B are both in the turbulent or laminar regime, different fluid velocities within the lengths 114B and 113B nevertheless result in different heat transfer coefficients h between the two lengths with higher velocity providing higher heat transfer. It should also be appreciated that the cross sectional area of the heat transfer fluid channel may be so modulated in combination with the other embodiments described herein (e.g., in FIGS. 2A-5B) modulation of the heat transfer fluid flow velocity may be For the depicted embodiment the channel cross-sectional area is modulated by machining the capping layer 227 to have relief where a larger cross-sectional area is to be (e.g., in non-targeted temperature zones that overly the channel length 114B) and to have a full capping layer thickness where a smaller cross-sectional area is to be (e.g., in targeted temperatures zones that overly the channel length 113B). FIG. 6B illustrates a cross-sectional view along the B-B' line of the temperature controlled plasma processing chamber component 100 depicted in FIG. 1, in accordance with an embodiment of the present invention. As illustrated, both the first and third lengths 112B and 114B of a heat transfer fluid channel within the non-targeted temperature zone 105 are associated with larger thermal resistances R1, for example because of a lower heat transfer coefficient attributable to the reduced convection in laminar/lower velocity flow regimes within in heat transfer fluid channel lengths 112B and 114B. As further illustrated in FIGS. 6A and 6B, modulation of the heat transfer area between lengths of a heat transfer fluid channel may allow for a simplified assembly including only the layer 225 and a single level of channels. It should also be noted that larger cross-sectional areas may be provided by increasing a lateral width of the channel.

FIGS. 7 and 8 illustrate a plasma etch system including a temperature controlled component, in accordance with an embodiment of the present invention. The plasma etch system 700 may be any type of high performance etch chamber known in the art, such as, but not limited to, Enabler™, MxP®, MxP+™, Super-E™, DPS II AdvantEdge™ G3, or E-MAX® chambers manufactured by Applied Materials of CA, USA. Other commercially available plasma etch chambers may include similar temperature-controlled components. While the exemplary embodiments are described in the context of the plasma etch system 700, it should be further noted that the temperature control system architecture described herein is also adaptable to other plasma processing systems (e.g., plasma deposition systems, etc.) which present a heat load on a temperature-controlled component.

The plasma etch system 700 includes a grounded chamber 705. A substrate 710 is loaded through an opening 715 and clamped to a chuck 721. The substrate 710 may be any workpiece conventionally employed in the plasma processing art and the present invention is not limited in this respect. The plasma etch system 700 includes a temperature-controlled process gas showerhead 735. In the exemplary embodiment depicted, the process gas showerhead 735 includes a plurality of zones 110 (center) and 105 (edge), each zone independently controllable to a setpoint temperature. Other embodiments have either more than two zones. For certain embodiments with more than one zone, there are n heater zones and m coolant zones where n need not be equal to m. For example, in the embodiment depicted, a single cooling loop (m=1) passes through two temperature zones (n=2). Process gases, are supplied from gas source 745 through a mass flow controller 749, through the showerhead 735 and into the interior of the chamber 705. Chamber 705 is evacuated via an exhaust valve 751 connected to a high capacity vacuum pump stack 755.

When plasma power is applied to the chamber 705, a plasma is formed in a processing region over substrate 710. A plasma bias power 725 is coupled to the chuck 721 (e.g., cathode) to energize the plasma. The plasma bias power 725 typically has a low frequency between about 2 MHz to 60 MHz, and in a particular embodiment, is in the 13.56 MHz band. In the exemplary embodiment, the plasma etch system 700 includes a second plasma bias power 726 operating at about the 2 MHz band which is connected to the same RF match 727 as plasma bias power 725. A plasma source power 730 is coupled through a match 731 to a plasma generating element to provide source power to inductively or capacitively energize the plasma. The plasma source power 730 typically has a higher frequency than the plasma bias power 725, such as between 100 and 180 MHz, and in a particular embodiment, is in the 162 MHz band.

The temperature controller 775 may be either software or hardware or a combination of both software and hardware. The temperature controller 775 is to output control signals affecting the rate of heat transfer between the showerhead 735 and a heat source and/or heat sink external to the plasma chamber 705 based on at least temperature sensors 766 and 767. In the exemplary embodiment, the temperature controller 775 is coupled, either directly or indirectly, to the heat exchanger/chillers 777 and 782 (or heat exchanger/chillers 777 and a TE element, resistive heater, etc.).

The heat exchanger/chiller 777 is to provide a cooling power to the showerhead 735 via a heat transfer fluid loop 778 thermally coupling the showerhead 735 with the heat exchanger/chiller 777. In the exemplary embodiment, the heat transfer fluid loop 778 passes a liquid (e.g., 50% ethylene glycol in DI water at a setpoint temperature of −15° C.) through a coolant channel embedded in both the inner zone 110 and outer zone 105 (e.g., entering proximate to a first zone and exiting proximate to the other zone) of the showerhead 735 and may therefore incorporate any of the embodiments described herein to differentiate the heat transfer of the channel between the separate zones. The temperature controller 775 is coupled to a coolant liquid pulse width modulation (PWM) driver 780. The coolant liquid PWM driver 780 may be of any type commonly available and configurable to operate the valve(s) 720 for embodiments where those valves are digital (i.e., having binary states; either fully open or fully closed) at a duty cycle dependent on control signals sent by the temperature controller 775. For example, the PWM signal can be produced by a digital output port of a computer (e.g., controller 770) and that signal can be used to drive a relay that controls the valves to on/off positions.

In the embodiment depicted in FIG. 7, the system 700 includes the second heat exchanger/chiller 782 to provide a cooling power to the showerhead 735 via a heat transfer fluid loop 779. In the exemplary embodiment, the heat transfer fluid loop 779 is employed which passes a cold liquid (e.g., 50% ethylene glycol in DI water at a setpoint temperature of −15° C.) through a coolant channel embedded in only the outer zone 105 of the showerhead 735. The temperature controller 775 is coupled to a coolant liquid pulse width modulation (PWM) driver 781 to drive a relay that controls the valves 720 to on/off positions, etc.

FIG. 8 illustrates a schematic of the plasma etch system 800 including a temperature controlled substrate supporting chuck, in accordance with an embodiment of the present invention, and may be combined with the showerhead embodiment depicted in FIG. 7 for a plasma etch system including two temperature-controlled components. As further depicted in FIG. 8, the chuck 721 includes an inner zone 110 and outer zone 105, each coupled to a separate heat source/sink (heat exchanger/chillers 777, 778). As illustrated the heat exchanger/chiller 777 is coupled to a heat transfer fluid channel in the chuck 721 that passes only through the inner zone 110 while the heat exchanger/chiller 778 is coupled to a heat transfer fluid channel in the chuck 721 that passes through both the outer zone 105 and the inner zone 110 and may therefore incorporate any of the embodiments described herein to differentiate the heat transfer of the channel between the separate zones.

It is to be understood that the above description is intended to be illustrative, and not restrictive. Many other embodiments will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims. Accordingly, the specification and drawings are to be regarded in an illustrative sense rather than a restrictive sense. The scope of the invention should, therefore, be determined with reference to the appended claims, along with the full scope of equivalents to which such claims are entitled.

What is claimed is:

1. A plasma processing chamber component, comprising:
a working surface to be disposed within a plasma processing chamber;
a first channel disposed in the component subjacent to the working surface, wherein the first channel is to conduct a first heat transfer fluid, and wherein a first length of the first channel subjacent to a first temperature zone of the working surface comprises a lower heat transfer coefficient than a second length of the first channel subjacent to a second temperature zone of the working surface; and
a second channel disposed in the component subjacent to the first zone of the working surface, wherein the second channel is to conduct a second heat transfer fluid, and wherein the first channel is isolated from the second channel, and wherein the heat transfer coefficient along the first length is lower than along a length of the second channel.

2. The component of claim 1 wherein the second length is downstream of the first length.

3. The component of claim 2, wherein the first temperature zone is disposed adjacent to the second temperature zone.

4. The component of claim 3, wherein the working surface is circular and wherein the first temperature zone comprises an annular portion of the working surface circumscribing the second temperature zone.

5. wherein the first channel further comprises a third length downstream of the second length and subjacent to the first temperature zone, the heat transfer coefficient being lower along than third length than along the second length.

6. The component of claim 1, wherein the heat transfer coefficient along the first length is lower than the second length.

7. The component of claim 6, wherein the first length comprises a channel sleeve of a thermally resistive material to increase the thermal resistance relative to the second length.

8. The component of claim 6, wherein the first channel is disposed at a greater distance subjacent to the working surface along the first length than along the second length.

9. The component of claim 6, wherein a thermal break is disposed between the first channel and the working surface along at least a portion of the first length to increase the thermal resistance relative to the second length.

10. The component of claim 9, wherein the thermal break comprises an evacuated space or a non-metallic material.

11. A plasma processing chamber component, comprising:
a working surface to be disposed within a plasma processing chamber;
a first channel disposed in the component subjacent to the working surface, wherein the first channel is to conduct a first heat transfer fluid, and wherein a first length of the first channel subjacent to a first temperature zone of the working surface comprises a lower heat transfer area than a second length of the first channel subjacent to a second temperature zone of the working surface; and
a second channel disposed in the component subjacent to the first zone of the working surface, wherein the second channel is to conduct a second heat transfer fluid, and wherein the first channel is isolated from the second channel, and wherein the heat transfer area along the first length is lower than along a length of the second channel;
wherein the first length has a first cross-sectional area larger than a second cross-sectional area of the second length to vary a flow velocity between the first and second lengths
wherein the first cross-sectional area is sufficiently large to ensure laminar flow of the first liquid along at least a portion of the first length while the second cross-sectional area is sufficiently small to induce turbulent flow of the first liquid along at least a portion of the second length.

12. The component of claim 1, wherein the heat transfer area along the first length is lower than along the second length.

13. The component of claim 12, wherein the first channel comprises a number of fins along the second length absent from the first length.

* * * * *